(12) United States Patent
Schwarzbauer

(10) Patent No.: US 6,776,329 B2
(45) Date of Patent: Aug. 17, 2004

(54) METHOD FOR PRODUCING A HEAT-CONDUCTING CONNECTION BETWEEN TWO WORK PIECES

(75) Inventor: Herbert Schwarzbauer, Munich (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/240,243

(22) PCT Filed: Mar. 12, 2001

(86) PCT No.: PCT/DE01/00932
§ 371 (c)(1),
(2), (4) Date: Sep. 30, 2002

(87) PCT Pub. No.: WO01/75963
PCT Pub. Date: Oct. 11, 2001

(65) Prior Publication Data
US 2003/0102356 A1 Jun. 5, 2003

(30) Foreign Application Priority Data
Mar. 31, 2000 (DE) .................. 100 16 129

(51) Int. Cl.⁷ .................. B23K 31/02; B22F 1/00; B22F 1/02
(52) U.S. Cl. .................. 228/204; 228/121; 228/123.1; 419/2; 419/38; 419/52
(58) Field of Search .................. 228/121, 204, 228/228, 262.1, 123.1, 253, 256; 419/2, 38, 48–53

(56) References Cited
U.S. PATENT DOCUMENTS

| | | | |
|---|---|---|---|
| 3,693,750 A | * | 9/1972 | Takkunen .................. 428/558 |
| 4,810,672 A | * | 3/1989 | Schwarzbauer .................. 228/123.1 |
| 4,856,185 A | | 8/1989 | Baumgartner et al. |
| 5,058,796 A | | 10/1991 | Schwarzbauer |
| 5,178,744 A | * | 1/1993 | Nakazawa et al. .................. 204/425 |
| 5,217,666 A | * | 6/1993 | Tamaru et al. .................. 264/112 |
| 5,342,703 A | * | 8/1994 | Kawasaki et al. .................. 429/32 |
| 5,494,762 A | * | 2/1996 | Isoyama et al. .................. 429/221 |
| 5,893,511 A | | 4/1999 | Schwarzbauer |
| 5,903,813 A | * | 5/1999 | Moxson et al. .................. 419/28 |
| 6,610,246 B1 | * | 8/2003 | Sunamoto .................. 419/52 |
| 2003/0020159 A1 | * | 1/2003 | Schwarzbauer .................. 257/705 |

FOREIGN PATENT DOCUMENTS

| | | |
|---|---|---|
| DE | 34 14 065 | 12/1985 |
| DE | 100 09 678.6 | 7/2001 |
| EP | 0 242 626 | 10/1987 |
| JP | 60 066440 | 4/1985 |

OTHER PUBLICATIONS

Dissertation von Sven Klaka. "Eine Niedertemperatur–Verbindungsrechnik zum Aufbau von Leistungshalbteitermodulen," Cuvillier Verlag, Gottingen, 1997.

Bergmann, "Werkstofftechnik," Tell 2:Anwendung, Selte 83–84, Carl–Hanser–Verlag Munchen Wein 1987, ISBN 3–446–14128–6.

Spur, "Handbuch der Fertigungstechnik," Band 1, Urformen, Seite 887–888, Carl–Hanser–Verlag Munchen Wein 1981, ISBN 3–446–12532–9.

* cited by examiner

Primary Examiner—L. Edmondson
(74) Attorney, Agent, or Firm—Young & Thompson

(57) ABSTRACT

A method for producing a heat-conducting connection between two work pieces (1, 2) includes the steps of first producing a porous sintered layer (3), interposed between the two work pieces (1, 2) and sintered onto every work piece (1, 2) across a certain area, and subsequently compacting the porous sintered layer (3) sintered onto the two work pieces (1, 2) by pressing the two work pieces (1, 2) against each other.

13 Claims, 2 Drawing Sheets

METHOD FOR PRODUCING A HEAT-CONDUCTING CONNECTION BETWEEN TWO WORK PIECES

CROSS REFERENCE TO RELATED APPLICATION

This is the 35 USC 371 National Stage of International Application PCT/DE01/00932 filed on Mar. 12, 2001, which designated the United States of America.

FIELD OF THE INVENTION

The invention relates to a process for producing a heat-conducting connection between two workpieces.

BACKGROUND OF THE INVENTION

For structures with highly heat-producing workpieces, for example workpieces in the form of electrical or electronic components, good heat-conducting connecting technology is necessary for heat dissipation.

Conventionally the components are soldered. The temperature stability and thermal fatigue resistance of solder is however very limited.

EP-0 242 626 A2 (GR 86 P 1242) discloses a process for producing a heat-conducting connection between a workpiece in the form of an electronic component and a workpiece in the form of a substrate, in which a paste is applied to the component and/or the substrate; the paste consists of a mixture of metal powder which sinters at the sintering temperature and sinters both to the component and also to the substrate, and of a liquid.

The paste is dried and after drying of the paste the component and the substrate are heated together or separately to a temperature which is at least 100° C., but is still below the sintering temperature. This heating is expressly unpressurized heating according to the document.

At latest after this heating the component is placed on the completely dried paste of the substrate. The entire arrangement is then heated to the sintering temperature with simultaneous application of mechanical pressure of at least 900 N/cm$^2$.

This known process is especially suited for large-area, power semiconductors which have been produced in MOS technology, major advantages however also being achieved in the production of other electronic components as well.

In the older German patent application 100 09 678.6 (GR 98 E 1895) which had not been published previously a process for producing a heat-conducting adhesive joint between two workpieces is proposed in which first of all a porous sintered layer of heat-conducting material, i.e. one which is penetrated with cavities like a sponge, especially of silver, is produced and is located between the two workpieces and is surface-sintered to each workpiece.

This sintered layer is filled with liquid hardenable cement which afterwards wets each workpiece. Filling takes place for example by sucking the liquid cement into the cavities of the sintered layer which act as capillaries.

Afterwards the cement is hardened and the adhesive joint is completed.

The sintered layer is produced such that a paste is applied to one workpiece and/or the other workpiece; the paste consists of a mixture of a powder which sinters at the sintering temperature and which sinters to each of the two workpieces at this temperature, and of a liquid; the two workpieces are brought together such that the paste is located between the two workpieces and makes contact between the surfaces of the two workpieces, afterwards the paste is dried and the dried powder is sintered by heating to the sintering temperature.

High density and thus good thermal conductivity of the sintered layer of heat-conducting material can also be achieved with the step of applying a certain mechanical pressure to the powder during the sintering process or after completion of this process.

Preferably a powder is used which is chosen from a group of metals, especially precious metals and semiprecious metals.

It is especially advantageous if a silver powder is used and sintering of this powder is carried out in an oxidizing atmosphere, since to sinter this powder a sintering temperature between 100° C. and 250° C. is advantageously sufficient. Sintering in an oxidizing atmosphere can however also be advantageous for sinterable powders which contain substances different from silver.

It is also mentioned that a high density and thus good thermal conductivity of the sintered layer of heat-conducting material can be achieved by applying a certain mechanical pressure to the powder during the sintering process or after completion of this process.

With the proposed process, larger workpieces can be advantageously joined to surfaces to be joined which are larger than 1 cm$^2$, for example 2×2 cm$^2$ or more, or even more, to one another securely over the entire surface.

SUMMARY OF THE INVENTION

The object of the invention is make available a process for producing an adhesive-free, heat-conducting connection between two workpieces, with which larger workpieces which have surfaces to be joined which are larger than 1 cm$^2$, for example 2×2 cm$^2$ or even more, can be connected to one another with high strength and very good heat conduction on these surfaces in their entirety.

This object is achieved by the features of claim 1.

According to this approach the process as claimed in the invention has the following steps:

Producing a porous sintered layer of heat-conducting material which is located between the two workpieces and is sintered superficially to each workpiece, and Subsequent compaction of the porous sintered layer which has been sintered to the two workpieces by pressing the two workpieces relatively against one another.

The porous sintered layer of heat-conducting material, i.e. one which is penetrated with cavities like a sponge, is produced preferably and advantageously by the following steps:

Application of a paste to one workpiece and/or the other workpiece which consists of a mixture of a powder of heat-conducting material which sinters at the sintering temperature and sinters to each of the two workpieces at this temperature, and a liquid, Bringing together the two workpieces such that the paste is located between the two workpieces and makes surface contact between the two workpieces, Drying of the paste, and Sintering of the dried powder by heating to the sintering temperature.

Preferably and advantageously a powder of heat-conducting material is used which sinters at a sintering temperature of at most 250° C. and moreover sinters to each of the two workpieces. Preferably a powder is used which is chosen from a group of metals, especially precious and semiprecious metals, and which sinters at the sintering temperature of at most 250° C. and moreover sinters to each of the two workpieces. Use of a sinterable metal powder which has silver is especially advantageous.

It is especially advantageous if the sintering itself and sintering of the powder to each workpiece are carried out at the sintering temperature in an oxidizing atmosphere. This applies especially when using a sinterable metal powder which has silver.

For subsequent compaction of the porous sintered layer which has been sintered to the two workpieces it is advantageous to use mechanical pressure which is chosen to be so high that as many cavities and pores of the porous sintered layer as possible, best all of them, are closed, but the two workpieces are not damaged.

It is especially advantageous if the subsequent compaction of the porous sintered layer which has been sintered to the two workpieces is carried out by pressure sintering. Pressure sintering here means applying the mechanical pressure used for subsequent compaction to the porous sintered layer with simultaneous heating of the porous sintered layer to the sintering temperature which can be the same or different from the sintering temperature used in the production of the porous sintered layer.

Pressure sintering has the advantage that the pores of the sintered layer close more easily and the strength of the connection produced by sintering together between the sintered layer and the workpieces can be increased even more.

For later compaction of the porous sintered layer which has been sintered to the two workpieces, feasibly and especially in pressure sintering a pressure of at least 900 N/cm² is used. An increase of this pressure to 1000 N/cm² or to 1500 cm² and more can be advantageous.

In the process as claimed in the invention, by producing the porous sintered layer which has been sintered to the workpieces a connection between the workpieces is produced which is strengthened by the subsequent compaction of the sintered layer especially by pressure sintering such that a high-strength, very good heat-conducting connection between the workpieces is formed, which can have a large area, especially larger than 2×2 cm², and is especially well suited for attachment of electronic components, especially power semiconductor components such as for example IGBTs, MOS-FETs, diodes, thyristors, etc., which during operation produce high power losses which must be efficiently dissipated in order not to exceed the maximum operating temperature.

The process as claimed in the invention moreover has other major advantages especially compared to the process known from EP-0 242 626 A2, including:

a) Simple positioning and fixing of a host of parts on a substrate, for example for multichip modules, power converters or the like;

b) Surface irregularities are filled and cause fewer problems, for example segregations on chips or roughness of the substrate. Thickness fluctuations and irregularities due to screen pressure, template pressure or spraying of metal—especially a silver layer—are eliminated and the density of the pressed sintered layer is more homogeneous.

c) At a lower sintering temperature the stiffness of the sinter bridges formed first in the sintered layer is still low according to the process as claimed in the invention, in this way at the same sintering pressure a higher compaction is achieved than in pressing the silver layer which has been sintered scratch-proof according to EP-0 242 626 A2 (see also the dissertation of Sven Klaka: "A low temperature connecting technology for building power semiconductor modules", Cuvillier Verlag, Goettingen 1997). The "softer" sintered layer according to the process as claimed in the invention is protected against damage by the workpieces between which it is located.

d) The sintering temperature used in the production of the sintered layer of the process as claimed in the invention essentially determines the connection temperature at which the workpieces are connected to one another without the mechanical tension due to different coefficients of thermal expansion. It can remain clearly below the sintering temperature which is used in pressure sintering.

The invention is detailed by way of example in the following description using the drawings.

DETAILED DESCRIPTION OF THE DRAWINGS

The heat-conducting connection as claimed in the invention between the two workpieces is detailed using the example of one preferred special production process.

Figure 1:
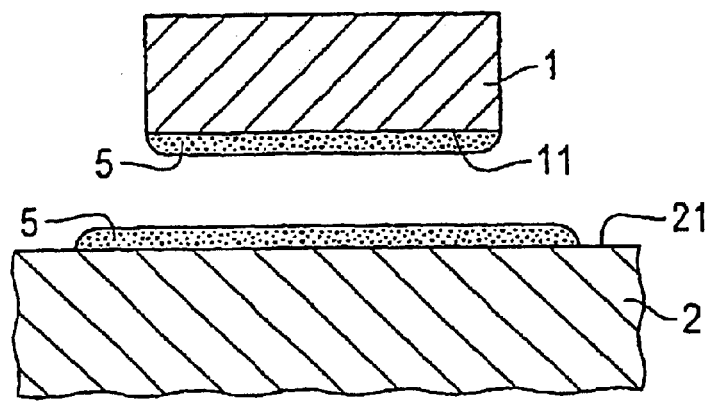
FIG. 1 shows in cross section two separate workpieces, to which one paste at a time which consists of a mixture of a powder which sinters at the sintering temperature and sinters to each of the two workpieces at this temperature, and of a liquid, is applied.

FIG. 1 shows as the initial stage of this process two workpieces 1 and 2 which are separate from one another and which have surface sections 11 and 21 which are opposite one another and are matched to one another in terms of shape, for example are flat.

For example, let the workpiece 1 be an electronic component, for example a power component, especially a power semiconductor component, and the workpiece 2 be a carrier body to which the electronic component is to be attached.

A paste 5 which consists of a mixture of a powder of heat-conducting material which sinters at the sintering temperature and sinters to each of the two workpieces at this temperature, and of a liquid, is applied to the surface section 21 of the workpiece 2 and/or to the surface section 11 of the workpiece 1. In FIG. 1 the paste 5 is shown applied to each workpiece 1 and 2, but it is sufficient to apply the paste 5 only to one workpiece, for example the workpiece 2.

Figure 2:
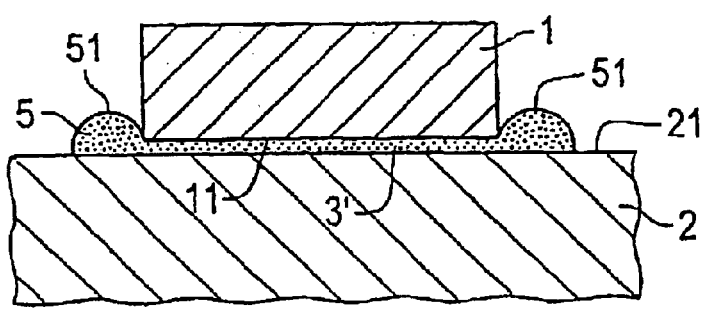
FIG. 2 shows the workpieces as shown in FIG. 1 in the same view but in the assembled state such that the paste forms a single continuous layer between the workpieces which brings the two workpieces into contact.

The two workpieces 1 and 2 are brought together after applying the paste 5 such that the paste 5 is located between the two workpieces 1 and 2 and the paste 5 makes contact between the surface section 11 and 21 of each workpiece 1 and 2 over as large an area as possible and forms a thin layer 3' between these sections 11 and 21, after which the intermediate stage of the process shown in FIG. 2 is formed.

Afterwards the layer 3' of paste 5 is dried and sintered after heating to the sintering temperature T.

For drying the paste 5 it is advantageous if the two joined workpieces 1 and 2 are pressed against one another so that the paste 5 is squeezed out of at least one workpiece, for example the workpiece 1, in a small bead 51, which surrounds this workpiece.

Drying of the paste 5 takes place for example by evaporation of the liquid contained in the paste 5, which can be done by heating the paste 5, for example during heating to the sintering temperature T and/or at a negative pressure, for example in a vacuum. The bead 51 advantageously contributes to the liquid being evaporated without residue and without bubble formation.

Figure 3:
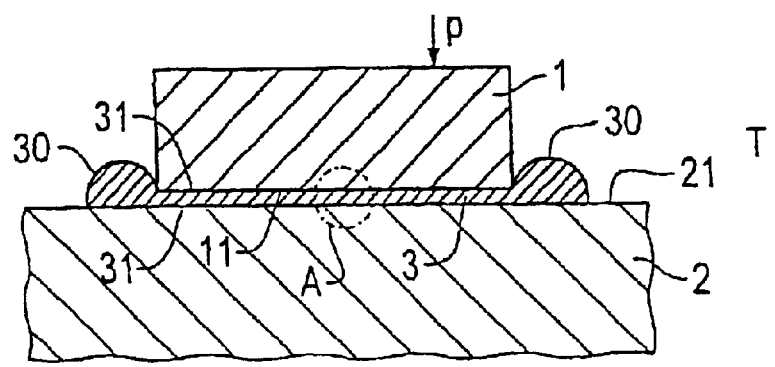
FIG. 3 shows the workpieces as shown in FIG. 2 in the same view, but after drying of the paste and sintering of the powder of thermally conductive material into a porous sintered layer which is located between the workpieces and brings the surfaces of the two workpieces into contact with one another.

After sintering of the dried powder at the sintering temperature T the intermediate stage of the process shown in FIG. 3 is formed.

This intermediate stage has a porous sintered layer 3 of dried powder which is located between the surface sections 11 and 21 of the workpieces 1 and 2 and which has two flat-sided surfaces 31, 31 facing away from one another and a bead 30 which surrounds at least one workpiece and which is formed from the bead 51.

One of the flat-sided surfaces 31, 31 borders the surface section 11 of the workpiece 1 over the entire surface, the other borders the surface section 21 of the workpiece 2 over the entire surface.

To increase the density of the porous sintered layer 3, during sintering mechanical pressure p can be applied to the powder, but it must remain so low that the sintered layer 3 remains porous.

The sintering temperature T is determined by the powder material.

Figure 4:
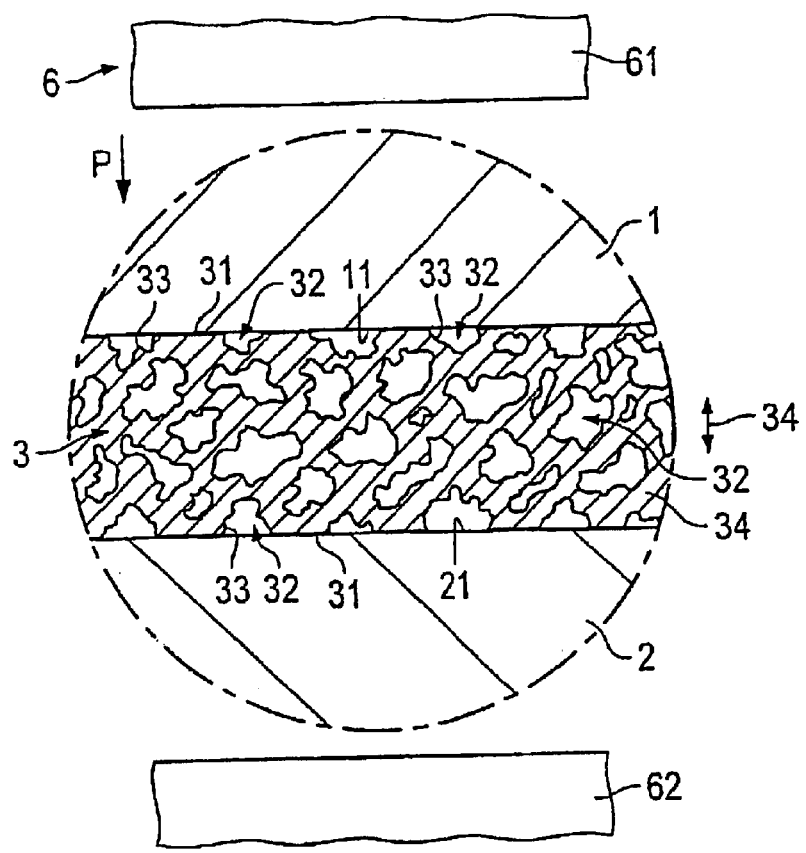
FIG. 4 shows a sector A surrounded in a circle shape in FIG. 3 in an enlargement.

The section A of FIG. 3 shown enlarged in FIG. 4 shows the internal structure of the sintered layer 3 by way of example and schematically.

In FIG. 4 the obliquely cross-hatched part 34 of the sintered layer 3 contains sintered powder or heat-conducting material which is coherent from one flat-sided surface 31 in the direction 25 to the other flat-sided surface 31 of the layer 3.

All non-crosshatched white areas 32 of the layer 3 represent cavities or pores of the layer 3. Although all these white areas would each have to be provided with reference numbers 32, for the sake of clarity only a few of these areas are labeled with this reference number 32.

The cavities or pores 32 penetrate the layer 3 like a sponge and are for the most part connected to one another, even if not in the cutting plane shown. Cavities 32 which border the flat-sided surfaces 31 each define one opening 33 in this surface 31.

For the process described so far all workpieces and materials given in EP 0 242 626 A2 and older German patent application 100 09 678.6, the liquid of the paste and the powder of the paste and the sintering temperatures and pressures given there can be used. The entire disclosure of EP 0 242 626 A2 and patent application 100 09 678.6 is a component of this application.

A sintered layer 3 of silver powder is especially suitable, since silver at low temperatures between 100° C. and 250° C., preferably between 150° C. and 250° C., can form silver bridges.

For example, suitable fine-grain silver powders are mixed for example with organic liquid, for example terpineol or ethylene glycol ether into a paste 5 which can be processed like a conductive cement paste.

After applying the paste 5, for example with a dispenser, to at least one of the two workpieces 1 or 2, which is for example a carrier body for an electronic component in the form of a chip, the other workpiece 2 or 1, in the example the chip, is placed on the paste 5 such that it squeezes out peripherally in a small bead 51. Thus, when the paste 5 is slowly heated the liquid can be evaporated without residue and without bubble formation and the paste 5 dried.

After drying, between the workpieces 1 and 2 a layer 3 and a bead 30 of dry silver powder which are sintered is formed.

For sintering of silver at less than 250° C. an oxidizing, preferably oxygen-containing atmosphere is essential. Surprisingly, in the thin layer 3 of silver powder of less than 100 microns between the workpieces 1 and 2 the oxygen can diffuse rather quickly so that sintering of the silver powder can take place in areas of up to 5×5 cm$^2$ or more. For example, in areas of 2×2 cm$^2$ sintering of the silver powder takes place within roughly 15 minutes.

It was found that silver powder in an $O_2$-containing atmosphere, for example in air, begins to sinter surprisingly at low temperatures beginning from 150° C. The sintering process in this case arises by the silver powder's consolidating into a sponge which has cavities or pores and acquiring a conspicuous adhesion capacity. For example, a hot tweezer tip at low pressure adheres to the consolidated sponge of silver powder. On many smooth surfaces such as for example silicon, glass, corundum, polyimide this adhesion occurs and it is strong enough to sinter for example a chip on glass and to cool it to room temperature. It also applies to silver that polished surfaces are especially well suited for this purpose since the silver particles come into close contact with the surface. At a high temperature this adhesive capacity recedes again.

The sintered layer 3 of silver powder produced in this way is penetrated in a sponge-like manner by cavities or pores 32 and on its flat-sided surfaces 31 has openings. The density of this layer 3, depending on the initial powder, is between 40 to 50% by volume silver and can be increased by adding much finer and also very much coarser powders. Instead of silver, also other substances with good thermal conductivity, but a low thermal expansion coefficient, such as for example SiC or diamond, can be used as coarse-grain powders for example to better match the coefficient of thermal expansion of the sintered layer 3 of silver powder to a chip.

A high silver density and thus good thermal conductivity can be achieved by using pressure at 150° C. to 250° C., and the pressure and time should remain far lower than in the conventional process according to EP 0 242 626 A2 so that the sintered layer 3 remains porous.

The sintered layer 3 imparts to the connection of the two workpieces 1 and 2 a certain strength.

Only now is the porous sintered layer 3 which has been sintered to the two workpieces 1 and 2 compacted by pressing the two workpieces 1 and 2 against one another in relative terms.

This can be carried out by placing the workpieces 1 and 2 which are connected by the porous sintered layer 3 between the dies 61 and 62 of a press which is generally labelled 6 and which is indicated in FIG. 4, as follows for example from EP 0 242 626 A2 and is used for pressure sintering in the process there, and which exerts mechanical pressure P on the sintered layer 3 via the workpieces 1 and 2.

Mechanical pressure P is used which is so high that as many cavities and pores 32 of the sintered layer 3 as possible, best all of them, are closed, but the two workpieces 1 and 2 are not damaged.

Figure 5:
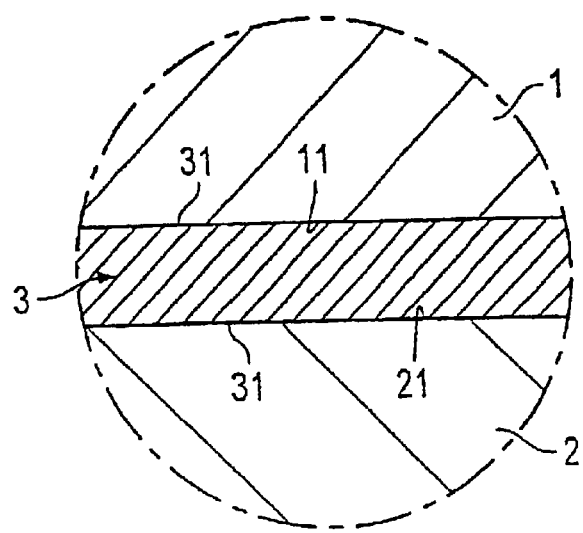
FIG. 5 shows the sector A as shown in FIG. 4 after compaction of the porous sintered layer, and the figures are schematic and not to scale.

FIG. 5 shows the sintered layer 3 which is located between the workpieces 1 and 2 and which has been sintered to each of them, which was porous beforehand and now for example no longer has visible pores, after this compaction.

The strength of the connection can be increased if the subsequent compaction of the porous sintered layer 3 which has been sintered to the two workpieces 1 and 2 is carried out by pressure sintering.

The pressure P which is used for subsequent compaction of the porous sintered layer 3 which has been sintered to the two workpieces 1 and 2 should be at least 900 N/cm$^2$ and can be for example 1000 N/cm$^2$ or 1500 N/cm$^2$ and more.

What is claimed is:

1. Process for producing a heat conducting connection between two workpieces (1, 2), which comprises the steps of:

producing a porous sintered layer (3) of heat-conducting material which is located between the two workpieces (1, 2) and is sintered superficially to each workpiece (1, 2), and subsequently compacting the porous sintered layer (3) which has been sintered to the two workpieces (1, 2) by pressing the two workpieces relatively against one another (1, 2), wherein the step for producing the porous sintered layer (3) includes the steps of:

applying a paste (5) to at least one workpiece (1; 2), said paste comprising a mixture of a powder of heat-conducting material which sinters at a sintering temperature (T) to each of the two workpieces (1, 2), and a liquid, said powder being selected from a group of precious metals and semiprecious metals, bringing together the two workpieces (1, 2) such that the paste (5) is located between the two workpieces (1, 2) and makes surface contact between the two workpieces (1, 2), drying the paste (5), and sintering the dried powder by heating to the sintering temperature (T).

2. Process as claimed in claim 1, wherein the powder of heat-conducting material sinters at a sintering temperature (T) of at most 250° C.

3. Process as claimed in claim 1, wherein the powder is a sinterable metal powder which contains silver.

4. Process as claimed in claim 1, wherein the sintering itself and sintering of the powder to each workpiece (1, 2) are carried out at the sintering temperature (T) in an oxidizing atmosphere.

5. Process as claimed in claim 1, wherein the compacting step is carried out with mechanical pressure (P) which is so high that the pores (32) of the sintered layer (3) are closed, but the two workpieces (1, 2) are not damaged.

6. Process as claimed in claim 1, wherein the compacting step is carried out by pressure sintering.

7. Process as claimed in claim 1, wherein the compacting step is carried out at a pressure of at least 900 N/cm$^2$.

8. Process as claimed in claim 2, wherein the sintering itself and sintering of the powder to each workpiece (1, 2) are carried out at the sintering temperature (T) in an oxidizing atmosphere.

9. Process as claimed in claim 3, wherein the sintering itself and sintering of the powder to each workpiece (1, 2) are carried out at the sintering temperature (T) in an oxidizing atmosphere.

10. Process as claimed in claim 5, wherein the compacting step is carried out at a pressure of at least 900 N/cm$^2$.

11. Process as claimed in claim 6, wherein the compacting step is carried out at a pressure of at least 900 N/cm$^2$.

12. Process as claimed in claim 8, wherein the compacting step is carried out at a pressure of at least 900 N/cm$^2$.

13. Process as claimed in claim 9, wherein the compacting step is carried out at a pressure of at least 900 N/cm$^2$.

* * * * *